US007126505B2

(12) United States Patent
Avantaggiati

(10) Patent No.: US 7,126,505 B2
(45) Date of Patent: *Oct. 24, 2006

(54) METHOD FOR IMPLEMENTING A FRACTIONAL SAMPLE RATE CONVERTER (F-SRC) AND CORRESPONDING CONVERTER ARCHITECTURE

(75) Inventor: Vito Antonio Avantaggiati, Rome (IT)

(73) Assignee: Accent S.p.A., Vimercate (MI) (IT)

( * ) Notice: Subject to any disclaimer, the term of this patent is extended or adjusted under 35 U.S.C. 154(b) by 0 days.

This patent is subject to a terminal disclaimer.

(21) Appl. No.: 11/065,013

(22) Filed: Feb. 24, 2005

(65) Prior Publication Data
US 2005/0184889 A1    Aug. 25, 2005

(30) Foreign Application Priority Data
Feb. 24, 2004    (EP) ............................... 04425111.4

(51) Int. Cl.
*H03M 7/00*    (2006.01)
(52) U.S. Cl. .......................................... 341/61; 341/58
(58) Field of Classification Search .............. 341/55–65
See application file for complete search history.

(56) References Cited

U.S. PATENT DOCUMENTS

| 5,907,295 | A * | 5/1999 | Lin ............................... 341/61 |
| 6,275,836 | B1 | 8/2001 | Lu ............................... 708/313 |
| 6,362,755 | B1 * | 3/2002 | Tinker ........................... 341/61 |
| 6,489,901 | B1 * | 12/2002 | Venkitachalam et al. ..... 341/61 |
| 6,542,094 | B1 * | 4/2003 | Venkitachalam et al. ..... 341/61 |
| 6,570,514 | B1 * | 5/2003 | Velazquez ................... 341/118 |
| 6,608,572 | B1 * | 8/2003 | Venkitachalam et al. ..... 341/61 |
| 6,642,863 | B1 * | 11/2003 | Venkitachalam et al. ..... 341/61 |

FOREIGN PATENT DOCUMENTS

| EP | 0 561 067 | 9/1993 |
| EP | 0 657 999 | 6/1995 |

OTHER PUBLICATIONS

Chia-Chuan Hsiao, "Polyphase Filter Matrix for Rational Sampling Rate Conversions", Int'l Conference on Acoustics, Speech & Signal Processing, Dallas, Apr. 6-9, New York, IEEEE, USA, vol. 4, Conf. 12, pp. 2173-2176, Abstract XP-000925119, 1987.
Ronald Crochiere et al., "Interpolation and Decimation of Digital Signals—A Tutorial Review", Proceedings of the IEEEE, New York, USA; vol. 69, No. 3 dated Mar. 1, 1981, pp. 300-331; Abstract XP 000615159.
Wan H. Yim, Distortion Analysis for Multiplierless Sampling Rate Conversion Using Linear Transfer Functions, IEEE Signal Processing Letters, vol. 8, No. 5, May 2001, pp. 143-144.

* cited by examiner

*Primary Examiner*—Lam T. Mai
(74) *Attorney, Agent, or Firm*—Lisa K. Jorgenson; Allen, Dyer, Doppelt, Milbrath & Gilchrist, P.A.

(57) ABSTRACT

The method is based on a controlled, direct insertion/cancellation of samples in a processed data stream. An up-sampled data stream is generated by the input block providing signal samples having a frequency rate. An intermediate data stream generated by a Rate Adapting Stage providing signal samples adapted to an intermediate frequency rate. An output data stream is delivered by a final low pass filter, including M signal samples having a desired output sample frequency rate. The method provides a generation of an up-sampled weighted stream in the Rate Adapting Stage by weighting the signal samples of the up-sampled data stream via a set of weight. Then, the input frequency rate is adapted to the output frequency rate in Rate Adapting Stage by a direct insertion of zero samples into the processed stream when L<M, or by a direct cancellation of samples when L>M.

19 Claims, 17 Drawing Sheets

| SPECIFICATIONS FOR 44.1KHZ TO 48KHZ F-SRC (INPUT FIR FILTER+OUTPUT IIR FILTER) | |
|---|---|
| SRC main functional parameters | $L=147$ <br> $M=160$ <br> $P=P_{OUT}=16$ |
| Input/Output resolution | 16 bits |
| Number of FIR phases | 16 |
| Number of taps per phase | 64 |
| Total number of FIR taps | 976 |
| FIR coefficient resolution | 20 bits |
| ROM size for FIR coefficients | 488 words |
| RAM size for FIR tap line | 64 words |
| $Wg(h)$ coefficients resolution | 18 bits |
| ROM size for $Wg(h)$ coefficients | 74 words |
| Type of IIR filter | Elliptic |
| Number of IIR stages | 3 |
| Order of each IIR stage | 6 |
| IIR coefficient resolution | 30 bits |
| ROM size for IIR coefficients | 18 words |
| RAM size for IIR delay elements | 18 words |
| Attenuation at 20KHz | 0.0dB |
| -6dB cut-off frequency | 21,868Khz |
| Band-pass ripple | <0.003dB |
| Images rejection | <-91,0dB (0-20KHz) |

Fig.15

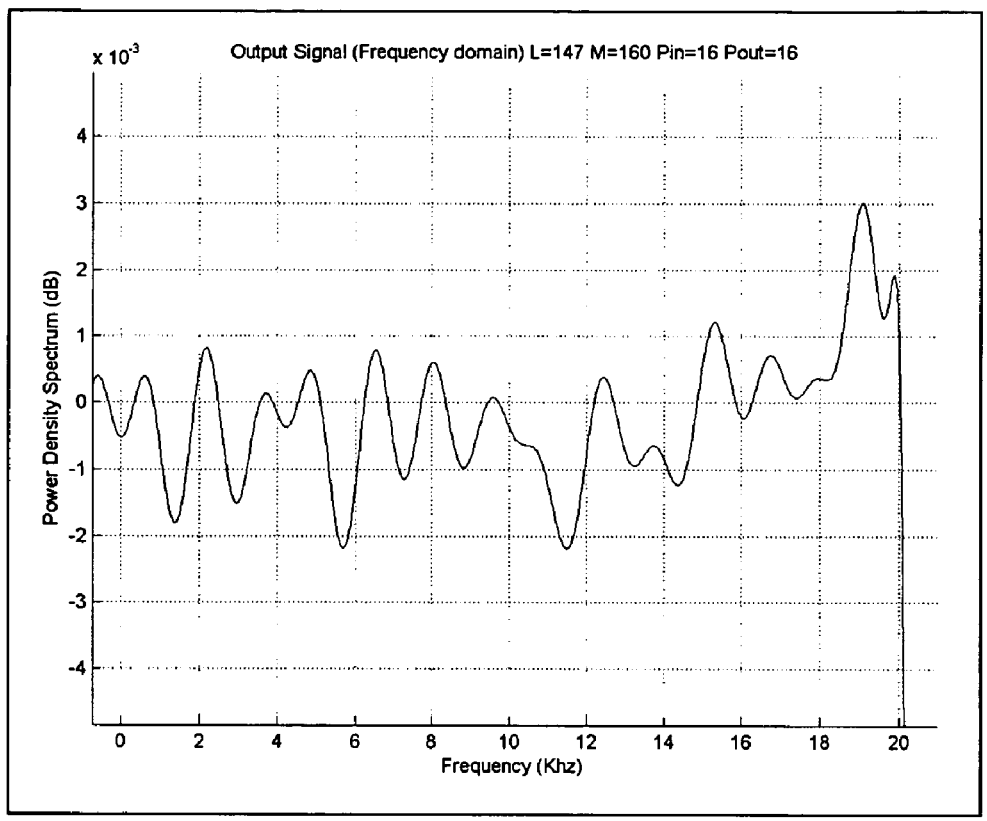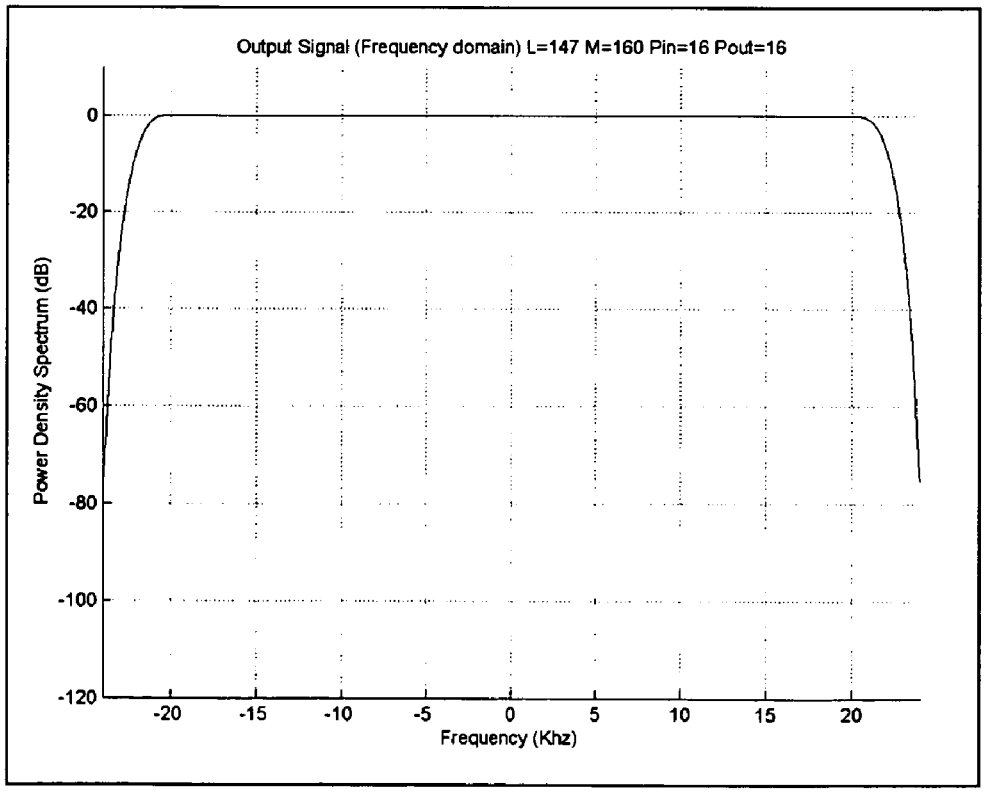
Fig.17

METHOD FOR IMPLEMENTING A FRACTIONAL SAMPLE RATE CONVERTER (F-SRC) AND CORRESPONDING CONVERTER ARCHITECTURE

FIELD OF THE INVENTION

The present invention relates generally to a method for the Implementation of a Fractional Sample Rate Converter (F-SRC), based on a controlled, direct insertion/cancellation of samples in a processed data stream. In particular, the method according to the present invention is applicable both to VLSI and real-time software implementations of F-SRCs. The present invention relates also to a Fractional Sample Rate Converter architecture (F-SRC) adapted for applying the above-mentioned method.

BACKGROUND OF THE INVENTION

Sample Rate Converters (SRC) are important VLSI (Very Large Scale of Integration) devices used in many segments of the consumer electronics market, such as Car Audio, Home Video/Home Theatre, Hi-Fi, and need to adapt the sample rates used by some standards to the rates required by emerging standards. A well-known example is the 44.1 KHz:48 KHz SRC, converting the earlier audio data rate of the CD format to the more qualitative data rate of DAT (Digital Audio Tape) and DVD (Digital Video Broadcasting).

A L:M Fractional SRC (F-SRC) receives L samples in a predefined interval $T_s$, and outputs M samples in the same interval $T_s$, being L, M integers: therefore, if L<M, it somehow 'creates' and 'inserts' M−L samples each L input samples into the output stream, or deletes L−M each L if L>M. These operations require special care and cannot be executed by directly inserting/canceling the |M−L| samples, because of the generation of images and alias signals into the output stream.

Therefore classical and known implementations of F-SRCs require an interpolator, anti-imaging/anti-aliasing FIR (Finite Impulsive Response) filter, working at the oversampling rate of $L*M/T_s$, samples/sec. Finally a L:1 decimation stage lowers the output rate down to $M/T_s$ samples/sec. In the following it is assumed that L, M, are coprime integers.

For example, in FIG. 1 is illustrated a typical and known implementation of a sampling rate conversion based on a polyphase filter structure. This is a bank of M FIR filters with identical number of taps, the same gain, but different phase delays. Each of the FIR banks is called a phase of the polyphase filter. The data stream is filtered with the M banks in parallel, therefore M stream are generated in the same time interval $T_s$, and the data rate is increased by a factor M. In a Rate Adapting Stage, the output of the polyphase filter is decimated times a factor L with a selection logic that selects 1 data each L in a round-robin, thus the final output rate turns out to be multiplied times a factor M/L. If the bandwidth and the phase delays of the polyphase filter are suitably chosen this processing performs the sample rate conversion from $L/T_s$ samples/sec to $M/T_s$ samples/sec preserving the spectral quality of the input signal.

This known method, although being simple, has however some drawbacks. First of all it is really expensive if L, M, are large and high quality of signal is required. As an example the case of a 44.1 KHz to 48 KHz SRC can be considered, where L=147 and M=160. If a 64 tap FIR filter is selected for each phase (and in some cases this may not be enough to meet high quality requirements), a total of 64*160=10240 filtering coefficient are required. This will greatly increase both the hardware size in terms of gates and the power consumption of the device and it is not feasible in practical applications.

SUMMARY OF THE INVENTION

An object of the present invention is to provide a method for the Implementation of a Fractional Sample Rate Converter (F-SRC) having a overall very low complexity, and having such respective features as to overcome the drawbacks mentioned with reference to the prior art.

The method according to the invention will use a process to adapt the input rate to the output rate based on direct insertion of zero samples into the input stream when L<M, or direct cancellation of samples when L>M. The processing is refined with a final low-pass filter to obtain the desired spectral characteristics of the output stream.

BRIEF DESCRIPTION OF THE DRAWINGS

The other features and advantages of the method and the converter architecture according to the present invention will be more apparent from the description of an embodiment thereof, given hereafter with reference to the attached drawings given by way of an indicative, non limiting example.

FIG. 15 is a table of specification for 44.1 kHz to 48 KHz SRC mode for an embodiment of the invention;

FIG. 17 is a graph illustrating spectral characteristics for 44.1 kHz to 48 KHz SRC whose specification are given in FIG. 15: Pulse response (input FIR+output IIR).

DETAILED DESCRIPTION OF THE PREFERRED EMBODIMENTS

Figure 12:
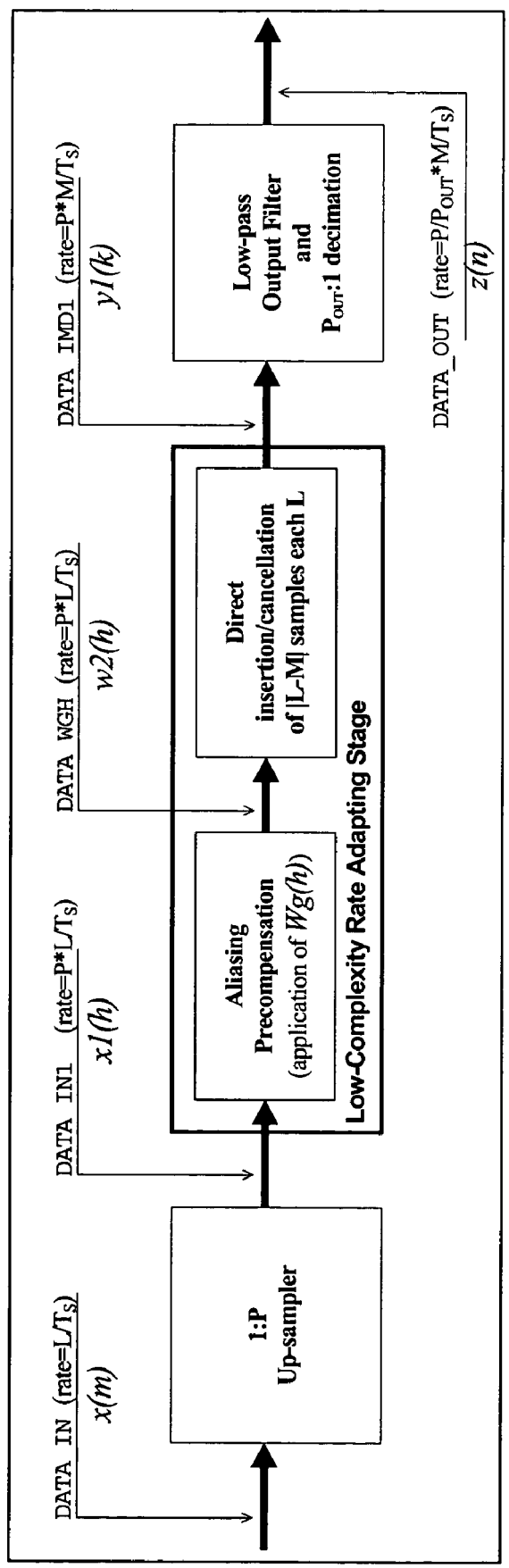
FIG. 12 is a schematic diagram illustrating a F-SRC architecture according to the present invention.

With specific reference to the embodiment of FIG. 12, a general block diagram of a Fractional Sample Rate Converter (F-SRC) architecture according to the invention is illustrated and which includes the following main blocks: 1:P upsampler stage; a Low-Complexity Rate Adapting Stage including an Aliasing Precompensation Block, and a block executing a controlled and direct insertion/cancellation of samples; and Low-pass output filter and P:1 decimator, wherein the Low-Complexity Rate Adapting Stage is the core of the present invention.

The Aliasing Precompensation Block used in the F-SRC architecture of the invention is based on a weighting technique whose features will be further disclosed. In the meantime, for a better understanding of the invention and to analyze each above block and its function, particularly the Rate Adapting Stage, it is convenient to first consider a reference architecture of a Fractional Sample Rate Converter (FIG. 2).

Figure 2:
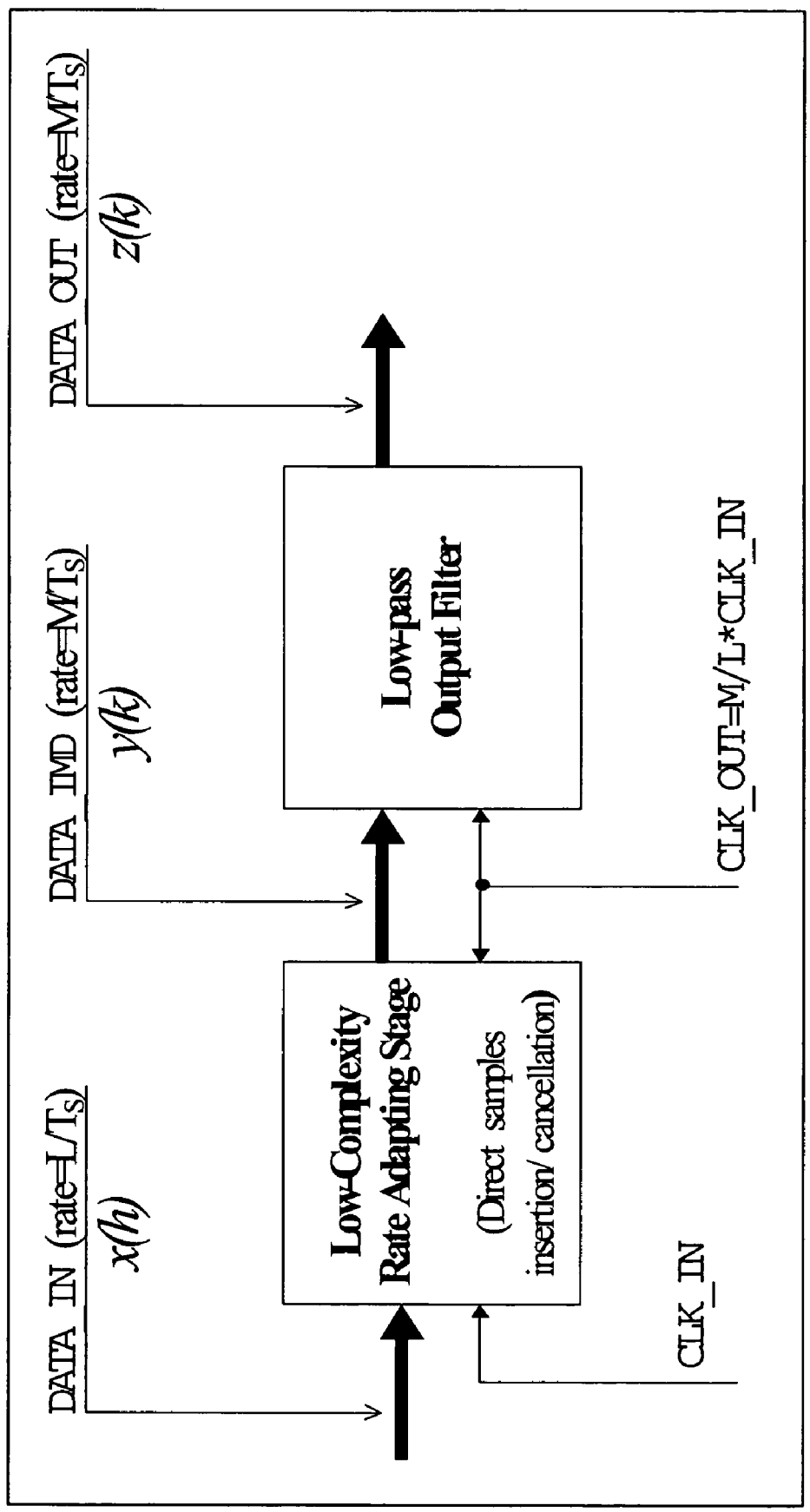
FIG. 2 is a schematic diagram illustrating a reference architecture of a Fractional Sample Rate Converter related to the present invention.

With reference to FIG. 2, an input stream $DATA_{13}$ IN is provided, whereby L signal samples in a time interval $T_s$ are delivered. x(h) corresponds to the samples of DATA_IN, whose rate is $f_{IN}$, and whose bandwidth is $f_s$. In other words $f_{IN}$ means the input sample frequency, i.e. the frequency of the input data clock, say CLK_IN, ($f_{IN}=L/T_s$). The method provides an output stream DATA_OUT, whereby M signal samples in the same time interval $T_s$ are delivered. Let $f_{OUT}$ be the output sample frequency, i.e. the frequency of the output data clock, say CLK_OUT, ($f_{OUT}=M/T_s$). To satisfy the Nyquist condition, the following equation shall hold:

$$f_s \leq \min(f_{IN}, f_{OUT}) \quad (1)$$

Further the Rate Adapting Stage is provided to generate an intermediate stream DATA_IMD, already adapted to the final rate $F_{OUT}$, whose samples are called y(k). Moreover, as depicted in FIG. 2, the stream DATA_IMD may require a further filtering process to achieve an output stream DATA_OUT with the desired spectral characteristics. According to the conventional terminology, the Rate Adapting Stage provides two operation modes, which we will distinguish up-sampling mode, i.e.: L<M, and down-sampling mode, i.e.: L>M. M, L, are supposed to be co-prime.

Figure 3:
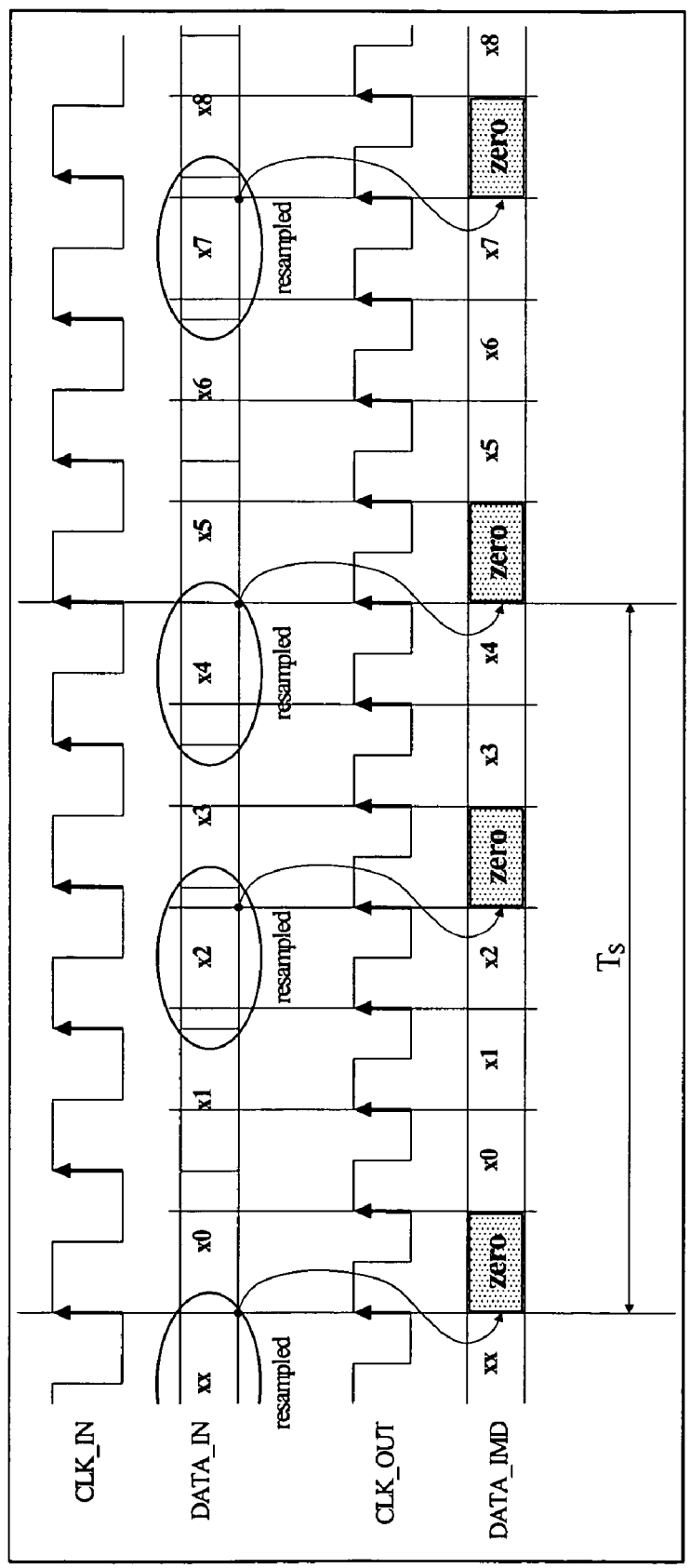
FIG. 3 is an example of a timing diagram relating to an "intermediate stream generation via zero insertions (up-sampling)" in the particular case L=5, M=7 for the F-SRC of FIG. 2.

In the reference architecture of FIG. 2, the Up-Sampling mode (L<M, $f_{IN}<f_{OUT}$) provides a direct zero-padding of M−L samples. A simple but raw way to generate the intermediate stream y(k), at the output rate $f_{OUT}$ is by directly inserting M−L zeros each L input samples x(h) in suitable locations, as described in the following: Since $f_{IN}<f_{OUT}$, if we resample the input stream x(h), whose rate is $f_{IN}$, with a clock at frequency $f_{OUT}$, some data are sampled twice, and repeated samples are generated. These doubled samples may be replaced with zeros. The related timing is shown in FIG. 3 for the particular case L=5, M=7.

Figure 4:
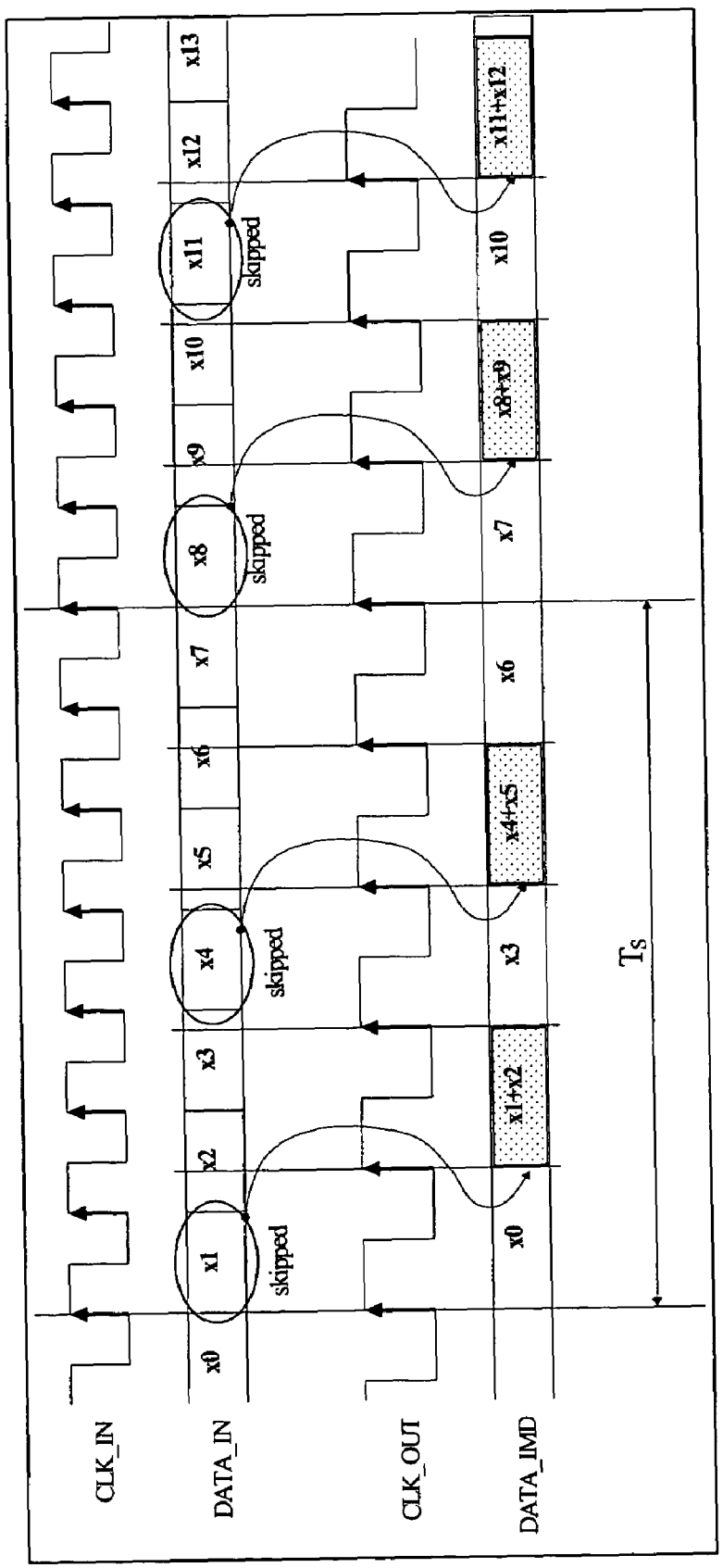
FIG. 4 is an example of a timing diagram relating to an "intermediate stream generation via direct sample cancellations (down-sampling)", in the particular case L=7, M=5 for the F-SRC of FIG. 2.

The Rate Adapting Stage, when in down-sampling mode (L>M, $f_{IN}>f_{OUT}$) should provide a direct cancellation of L−M samples. In this case a simple but raw rate conversion may be achieved by the consideration that, if we resample the input stream x(h), with a clock at frequency $f_{OUT}$, L−M samples are skipped each L samples, and they will miss from the output stream. The idea now is to sum each skipped sample to the next sample to not loose information. The related timing is shown in FIG. 4 for the particular case L=7, M=5.

It may be seen that these simple theoretical schemes for the up-sampling mode and down sampling mode work only under limited conditions, but a similar processing scheme will work even with L, M, suitable in many practical applications. To clarify this point, we consider the Rate Adapting Stage depicted in FIG. 5. In this FIG. 5: the block named '1:M zero-padding' inserts M−1 zeros between two consecutive samples of DATA_IN, thus achieving an up-sampled zero-padded stream, say DATA_OVS, whose samples are called w(j), at rate $Mf_{IN}$. The block named 'L:1 accumulate-decimate sync filter' is an accumulate/decimate sync filter whose order is L: each time L new samples of the DATA_OVS stream are input to the block, the block outputs their sum, thus generating the stream DATA_IMD at a rate reduced times a factor L. This is obtained via a L-length Moving Window, that executes the sum of the last received L samples, and via a final L:1 decimation stage.

It may be shown that the raw direct zero-padding technique and the raw direct cancellation technique described above, are equivalent to process the input stream with this processing scheme. To this end, let's limit for the moment our attention to the case:

$$0.5 < M/L < 2; \quad (2)$$

Figure 5:
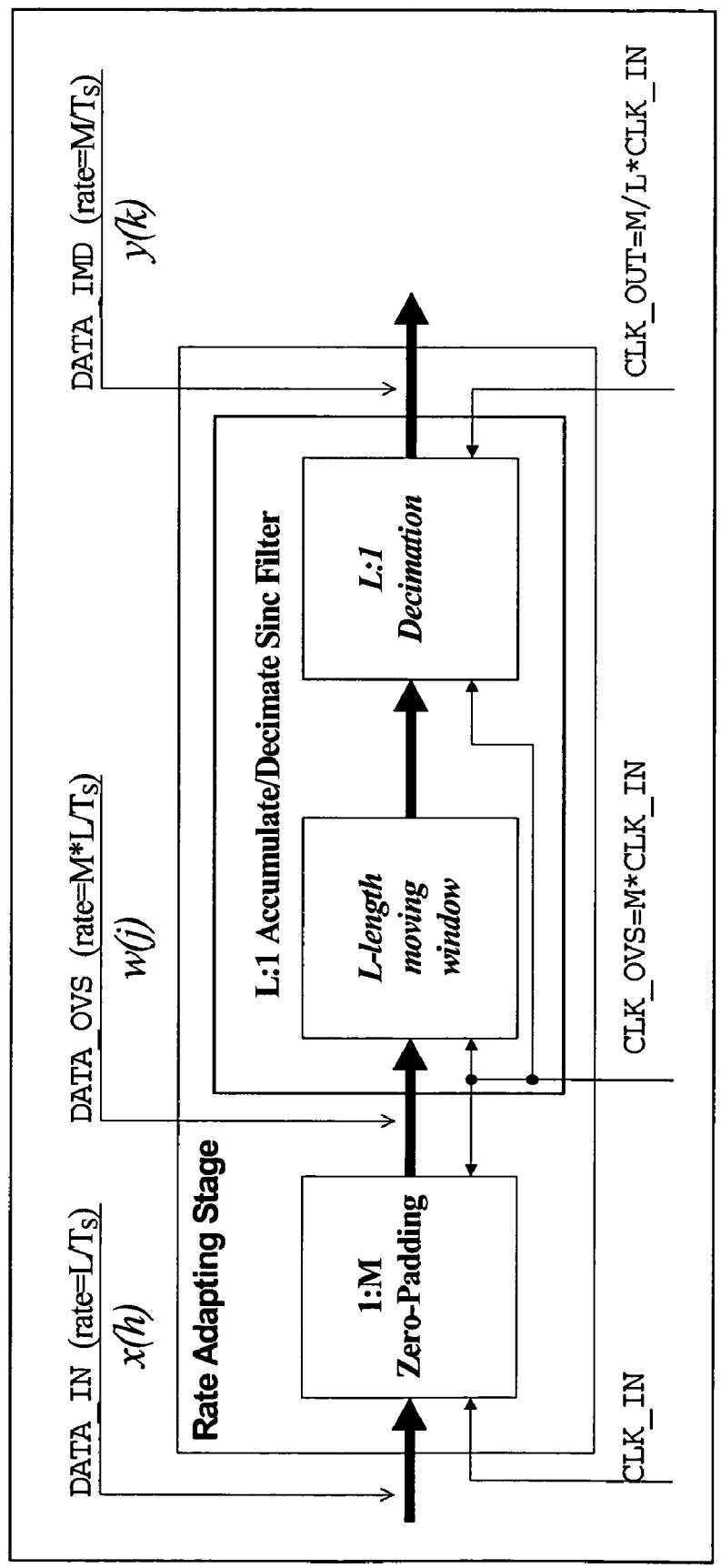
FIG. 5 is a schematic diagram illustrating a theoretical scheme for the zero insertion and direct samples cancellation processing.

In this case, for up-sampling mode, the samples of the stream DATA_IMD output from the Rate Adapting Stage of the block diagram of FIG. 5 are given by the following equations:

$$L \leq M: \quad (3)$$

y(k)=0, if div(kL,M)=div((k−1)L,M)

y(k)=x(div(kL,M)), if div(kL,M)≠div((k−1)L,M)

div (a,b) being the integer part of a/b.

Figure 6:
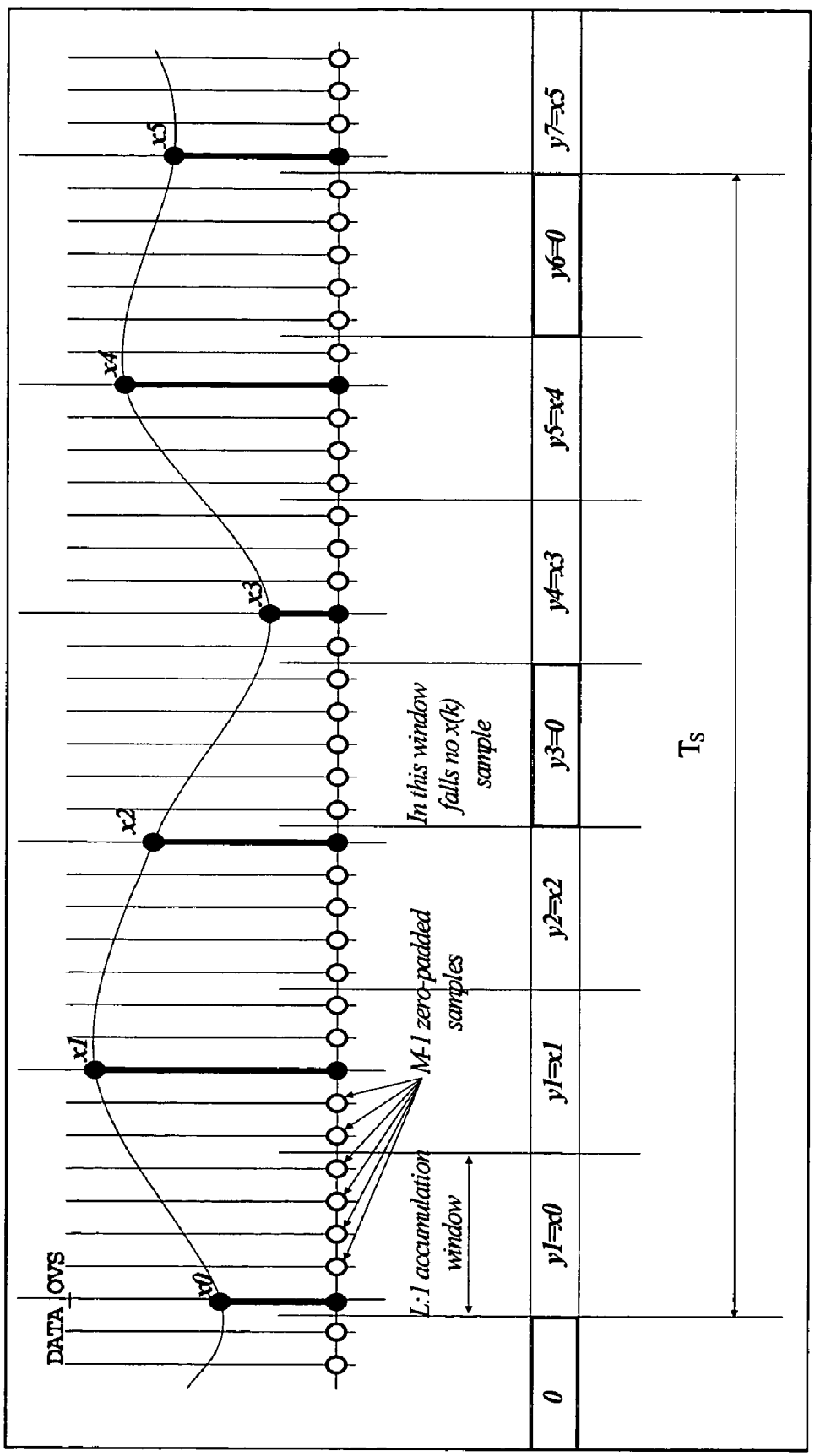
FIG. 6 is an operations diagram illustrating operations for the block diagram of FIG. 5, when in up-sampling mode (L=5, M=7)

These equations may be obtained by considering that in this case each L by L summation executed by the moving window can contain just 0 or 1 non-zero sample of x(h) (see FIG. 6). Thus if a single non-zero sample of x(h) falls into the moving window, y(k) is equal to this sample; on the other hand it will result y(k)=0 each time all samples falling within the moving window are zero-padded samples. It is important to point out that the 'if' condition of the first of these equations is equivalent to require that the same input data of x(h) is sampled twice within two consecutive clock cycles of CLK_OUT. This fact is clear if we consider that the quantity div(kL,M) represents the number of clock cycles of CLK_IN occurring within the k-th clock cycle of CLK_OUT. Hence it may be understood why the timing diagram of FIG. 3 even represents operations of the block diagram of FIG. 5.

For down-sampling operation mode, the output of the processing block of FIG. 5 is given by the following equations (under condition (2)):

L>M: (4)

Figure 7:
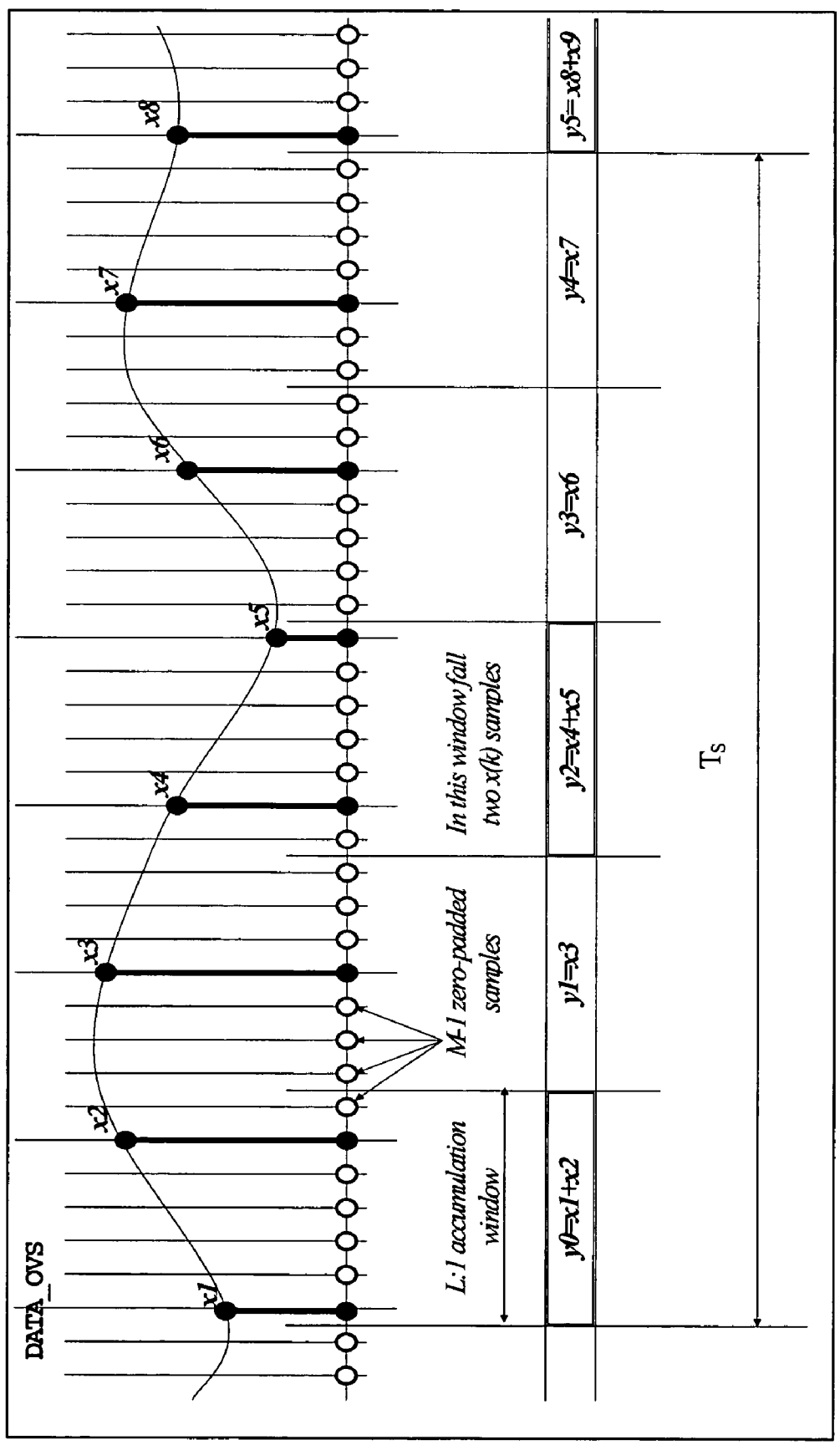
FIG. 7 is a operations diagram illustrating operations for the block diagram of FIG. 5, when in down-sampling mode (L=5, M=7)

$y(k)=x(div(kL,M))+x(div(kL,M)+1)$, if $div(kL,M)=div((k-1)L,M)+2$ $y(k)=x(div(kL,M))$, if $div(kL,M) \neq div((k-1)L,M)+2$ These equations may be obtained by considering that in this case each L by L summation executed by the moving window can contain just 1, or 2 consecutive non-zero sample x(h) (see FIG. 7). Thus, if a single non-zero sample falls into the moving window, then y(k) is equal to this sample; on the other hand each time two consecutive non-zero samples x(h) fall together into the same moving window, then y(k) is equal to their sum. With similar consideration as in the previous case, it can be pointed out that the 'if' condition of the first of these equations is equivalent to require that an input data x(h) is skipped between two consecutive clock cycles of CLK_OUT. Hence it may be understood why the timing diagram of FIG. 4 even represents operations of the block diagram of FIG. 5.

FIG. 6 and FIG. 7 show examples of operation for the block diagram of FIG. 5, for the case of L=5, M=7, and L=7, M=5. It may be seen that the output stream of these figures is the same as in FIGS. 3, 4. We now investigate why the Rate Adapting Stage of FIG. 5 works only in a very limited number of cases. To this end, first consider the spectrum of DATA_OVS (see FIG. 8). This spectrum is built by M replicas ('images') of the baseband signal whose distance is $f_{IN}$ each other, and whose whole bandwidth is $Mf_{IN}$. For a generic frequency $f_o$, images are generated at frequencies (see equation 5):

$$f_i(k)=f_o+kf_{IN} \quad k=\pm1, \pm2, \pm3, \ldots, \pm div(M,2) \quad (5)$$

After L:1 decimation such images will generate aliased frequencies, say $f_a(k)$, into the output Nyquist band $[-f_{OUT}/2, f_{OUT}/2]$, resulting in spectral degradation. Locations of such aliases into the output Nyquist band may be obtained from $f_i(k)$ by subtracting an integer multiple of $f_{out}$, such that the result is reduced within the output Nyquist band. Therefore, the relationship between the image frequencies $f_i(k)$ in the input spectrum of DATA_IN and the related aliased frequencies $f_a(k)$ in the intermediate spectrum DATA_IMD is given (see the following equation):

$$f_a(k)=f_i(k)-u(kL/M)f_{OUT}=f_o+kf_{IN}-u(kL/M)f_{OUT} \quad k=\pm1, \pm2, \pm3, \ldots, \pm div(M,2) \quad (6)$$

where u(kL/M) is an integer number defined by:

$$kL/M-1/2 \leq u(kL/M) < kL/M+1/2 \text{ if } k \geq 0 \quad (7)$$

$$kL/M-1/2 < u(kL/M) \leq kL/M+1/2 \text{ if } k<0$$

Figure 8:
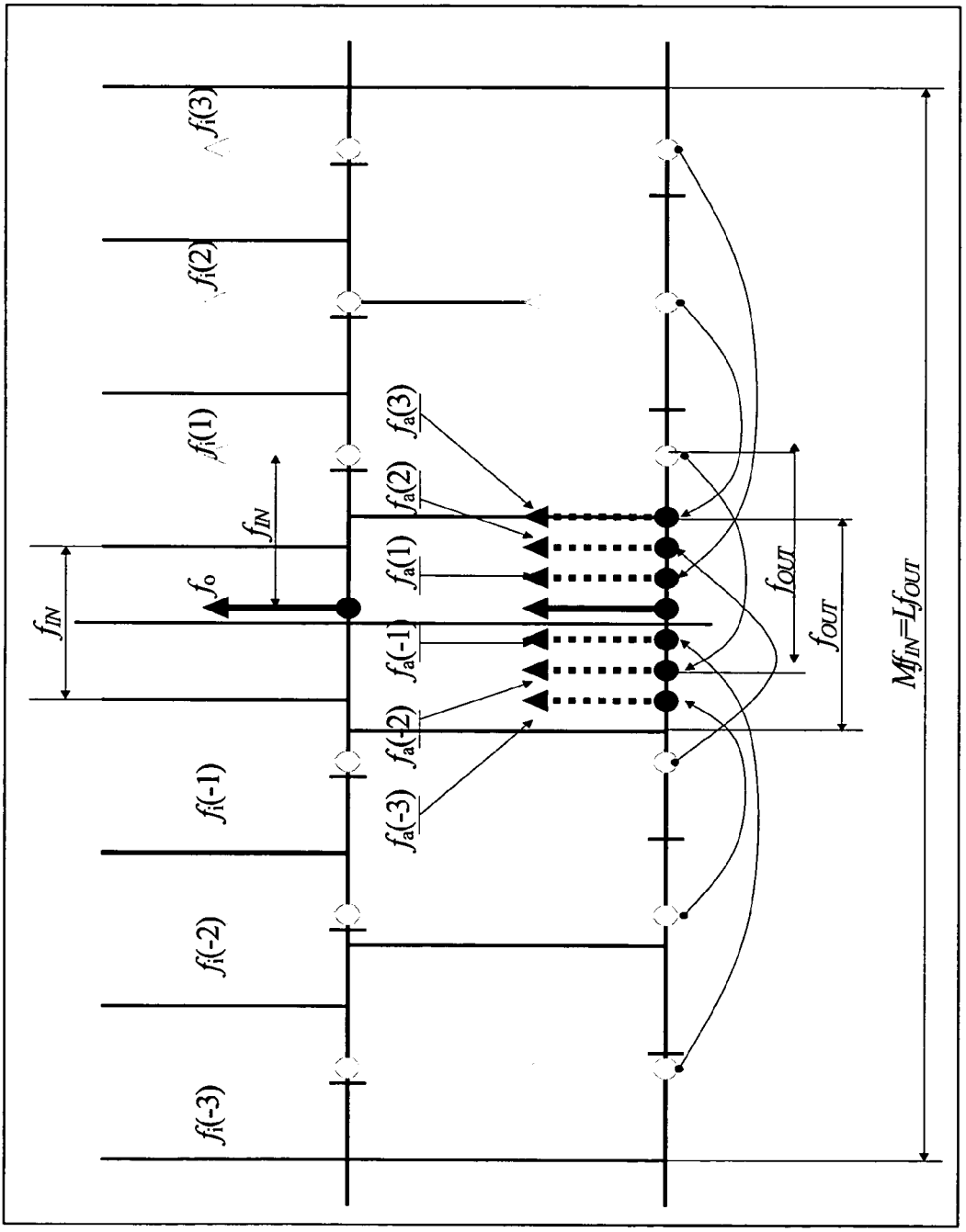
FIG. 8 is a schematic diagram illustrating an example of generation of image signals and related aliases for down-sampling mode (L=7, M=5)

An example is shown in FIG. 8 for down-sampling mode (up-sampling is very similar).

Figure 9:
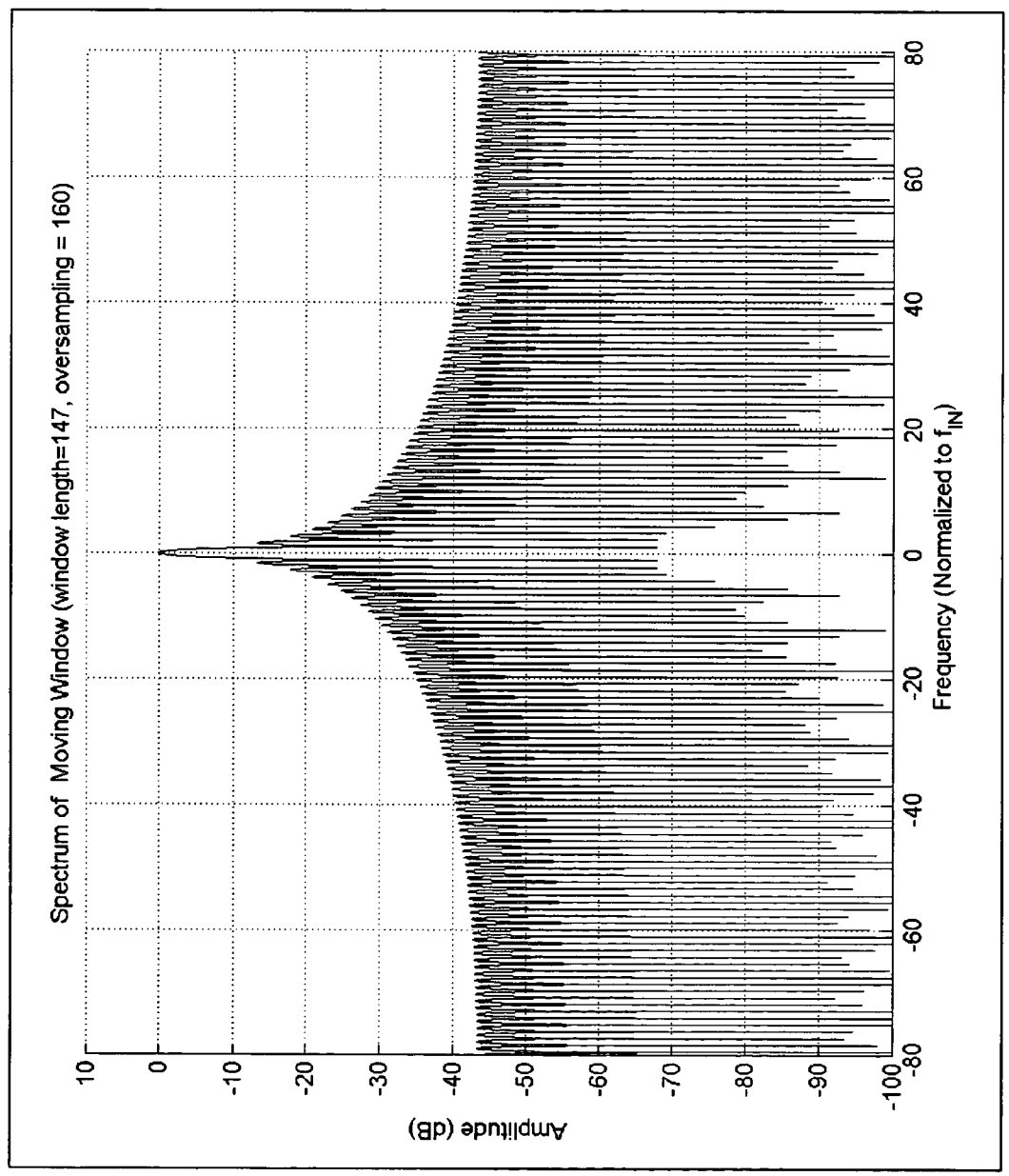
FIG. 9 is a graph illustrating spectral characteristics of accumulate-decimate sync filter for the case of a 44.1 Khz to 48.0 Khz F-SRC (normalized to input frequency $f_{IN}$)

Therefore to correctly reconstruct the signal spectrum at the output frequency $f_{OUT}$, the DATA_OVS stream should be filtered before the L:1 decimation with a filter whose stop-band should suppress all the generated images. On the contrary, the only applied filter to DATA_OVS in the Rate Adapting Stage of FIG. 5 is the moving window, having a frequency response H(f) given by (in the $f_{OUT}$ frequency domain):

$$H(f) = \frac{\text{sinc}\left(\pi \frac{f}{fOUT}\right)}{\text{sinc}\left(\pi \frac{f}{LfOUT}\right)} \quad (8)$$

given sync(x)=sin(x)/x. This function has a poor low-pass characteristic in most practical cases, with not enough attenuation in the stop-band to suppress the images, and a great distortion in the pass-band. Spectral characteristics of this filter are plotted in FIG. 9, for the case of a 44.1 Khz to 48.0 Khz Sample Rate Converter.

In the following equations we analyze how to modify the Rate Adapting Stage of FIG. 5 and to make it work even with M, L, values suitable in industrial applications. To this end, consider the aliases generated by the images of the $f_o=0$ frequency. They may be computed from (6), by substituting $f_o=0$. Thus aliases $f_a(k)$ of $f_o=0$ are given:

$$f_a(k)=kf_{IN}-u(kL/M)f_{OUT} \quad k=\pm1, \pm2, \pm3, \ldots, \pm div(M,2)$$

or, after few arithmetical manipulations:

$$f_a(k)=v(kL,M) \cdot (f_{OUT}/M) \quad k=\pm1, \pm2, \pm3, \ldots, \pm div(M,2) \quad (9)$$

where:

$$v(kL,M)=kL-u(kL/M)M \quad (10)$$

From the equations (7), (9), (10), it may by verified that v(kL,M) ranges from −div(M,2) to div(M,2) step 1. Therefore we can characterize the lower aliased frequency, the higher aliased frequency, and the inter-alias minimum spectral distance as follows:

$\min(|f_a(k)|)=f_{OUT}/M$; (lower aliased frequency of $f_i=0$) (11)

$\max(|f_a(k)|)=(f_{OUT}/M) \cdot div(M,2)$; (higher aliased frequency of $f_i=0$)

$\Delta f_a=f_{OUT}/M$; (minimum inter-aliases spectral distance)

$k=\pm1, \pm2, \pm3, \ldots, \pm div(M,2)$

We suppose now to up-sample the input signal DATA_IN times a factor P and to execute the described processing. This will cause two main effects: from the equation (5), it is seen that images are generated at frequency distance $Pf_{IN}$ each other rather then $f_{IN}$; from the equation (11), it is seen that some aliases are kicked out of the signal bandwidth $[-f_s/2, f_s/2]$.

Figure 10:
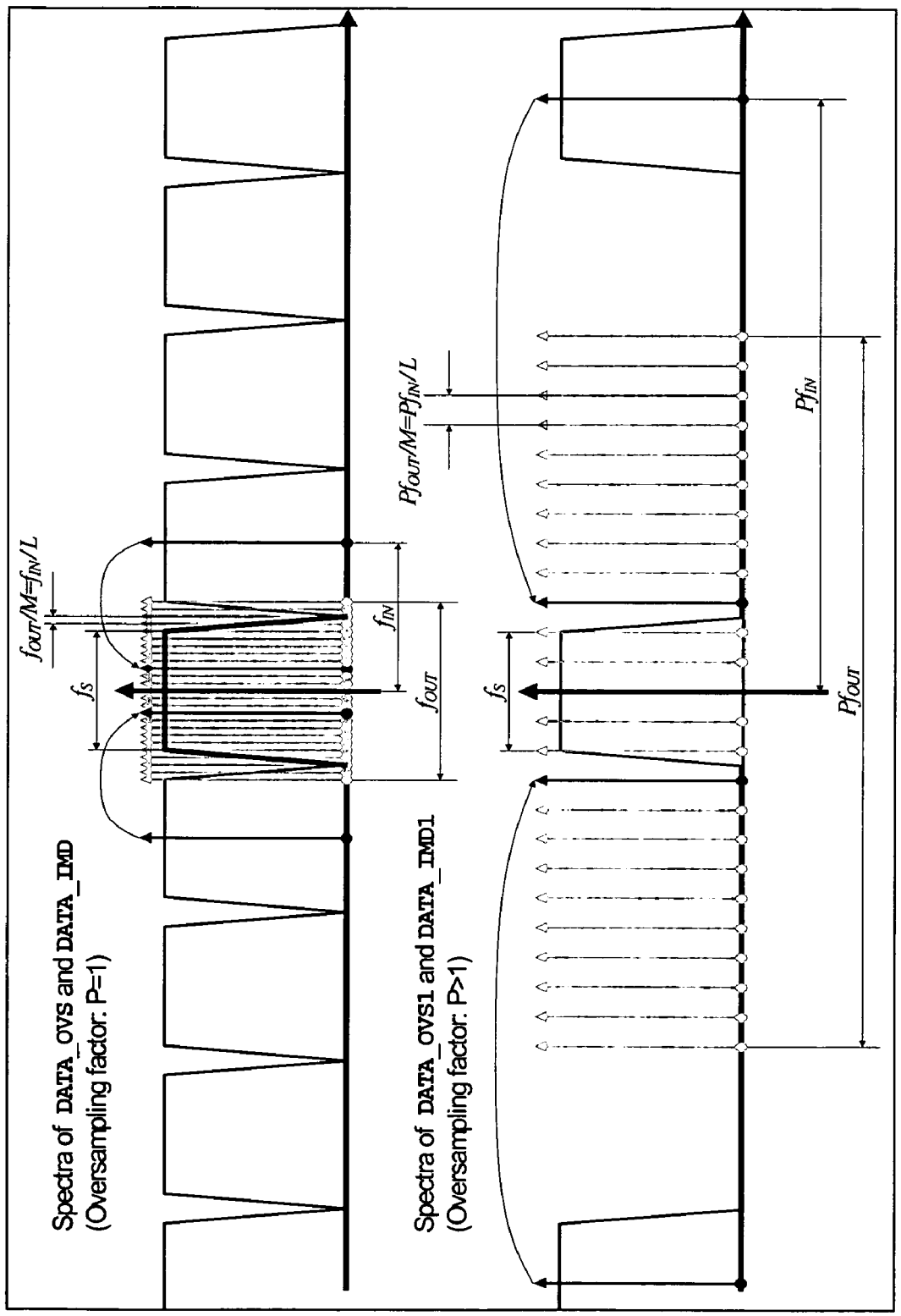
FIG. 10 is a schematic diagram illustrating benefits of increasing input sampling frequency on the images and aliases generated in the output stream.

The situation is depicted in FIG. 10. Note that the aliases of the $f_o=0$ falling within the new Nyquist output band $[-Pf_{OUT}/2, Pf_{OUT}/2]$, have the new inter-alias spectral distance $P\Delta f_a$ rather then $\Delta f_a$. On the contrary the signal spectrum remains unchanged (the signal is just up-sampled) and it will occupy just 1/P of the output bandwidth. This fact results in the reduction by a factor 1/P of the number of aliases falling inside the signal spectrum $[-f_s/2, f_s/2]$.

Therefore, once a P factor has been chosen greater then 1, two groups of aliases are generated: the aliases falling out of the signal spectrum $[-f_s/2, f_s/2]$; the aliases falling within the signal spectrum $[-f_s/2, f_s/2]$. The aliases falling out of the signal spectrum may be suppressed by filtering the intermediate signal y(k) with a suitable output filter. The aliases falling within the signal spectrum must be suppressed in advance, by filtering the images generating them before the L:1 decimation is executed. This may be done by suitably substituting the moving window with an improved weighting window when processing the signal DATA_OVS. This weighting window has improved spectral characteristics with respect to the spectral characteristics of the moving window whose spectral characteristics were expressed by equation 8 and FIG. 9.

The processing scheme of FIG. 5 may be modified now, according to the abovementioned guidelines, to make it work in many cases of practical interest.

Figure 11:
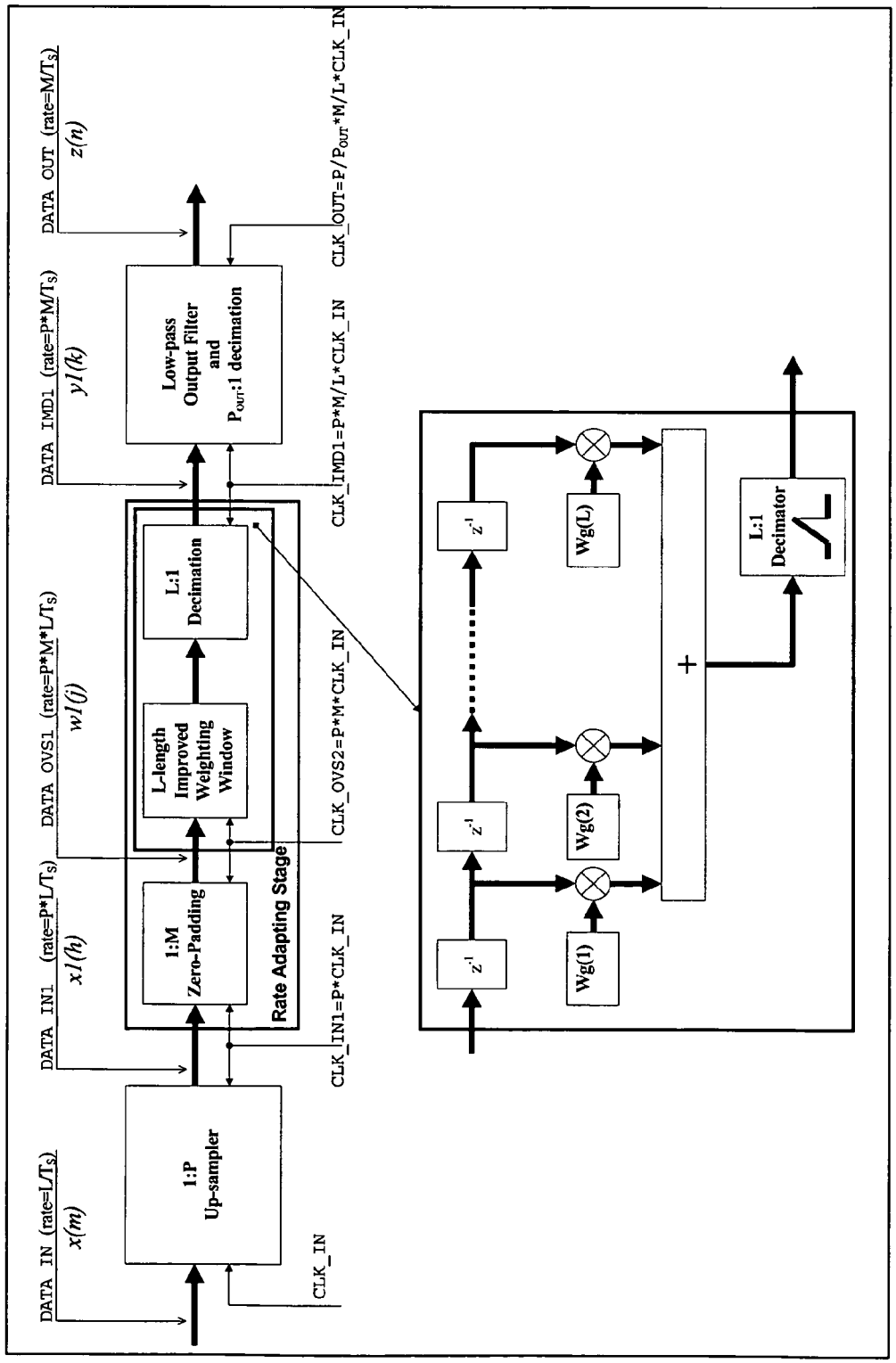
FIG. 11 is a schematic diagram illustrating a possible theoretical implementation of the inventive F-SRC architecture.

In this respect, a purely theoretical block diagram for a modified processing is shown in FIG. 11. This block diagram includes the following main blocks: 1:P Up-sampler: to implement the described method, we need the samples of the input signal up-sampled times a factor P. Since we are starting from the signal samples x(h) running at rate $f_{IN}$, this first 1:P up-sampler stage executes the task to increase the input data rate from $f_{IN}$ to $P*f_{IN}$. This 1:P Up-sampler is not architecture dependent and may be implemented via whichever up-sampling technique, as interpolation or even via a classical polyphase FIR filter, analogous to the one depicted in FIG. 1, but with lowered complexity owing to the fact that, as it will be shown further, it will result P<<M in a lot of cases of practical interest. A Rate Adapting Stage: this is the core of the inventive processing. It receives a stream whose rate is $P*f_{IN}$, and outputs a stream whose rate is $(M/L)*P*f_{IN}=P*f_{OUT}$. It performs a similar processing to the one depicted in FIG. 5, except that an improved weighting window is applied to the stream before the L:1 decimation, substituting the Moving Window of FIG. 5. This improved weighting window is needed to suppress those images in DATA_OVS1 that would generate aliases within the spectrum of the signal, [−fs/2, fs/2], after the first L:1 decimation. The difference between the Moving Window of FIG. 5 and the improved Weighting Window of FIG. 11 is that, while in the first case the samples w(j) are simply accumulated, in the second case the samples w1(h) are accumulated after having been weighted via a set of weights Wg(h) suitably chosen, in such a way to achieve the desired suppression of images before the L:1 decimation is executed. Low-Pass output filter and P:1 decimator: this stage suppresses the aliases falling out of the spectrum of the signal, [−fs/2, fs/2], before the second decimation (P:1) is executed. Moreover, it will decimate the stream times a factor P thus reducing the output rate down to $(M/L)*f_{IN}=f_{OUT}$. It is not architecture dependent and may be implemented both in a FIR or IIR fashion. It may be noted that the decimation factor P of the Low-Pass and decimation output filter may be equal to the up-sampling factor P of the up-sampler input block. However, when the decimation factor P of the Low-Pass and decimate output filter is different from the up-sampling factor P of the up-sampler input block the conversion rate is given by (L P)/(M $P_{OUT}$), where $P_{OUT}$ denotes the output decimation factor, $P_{OUT} \neq P$.

Figure 1:
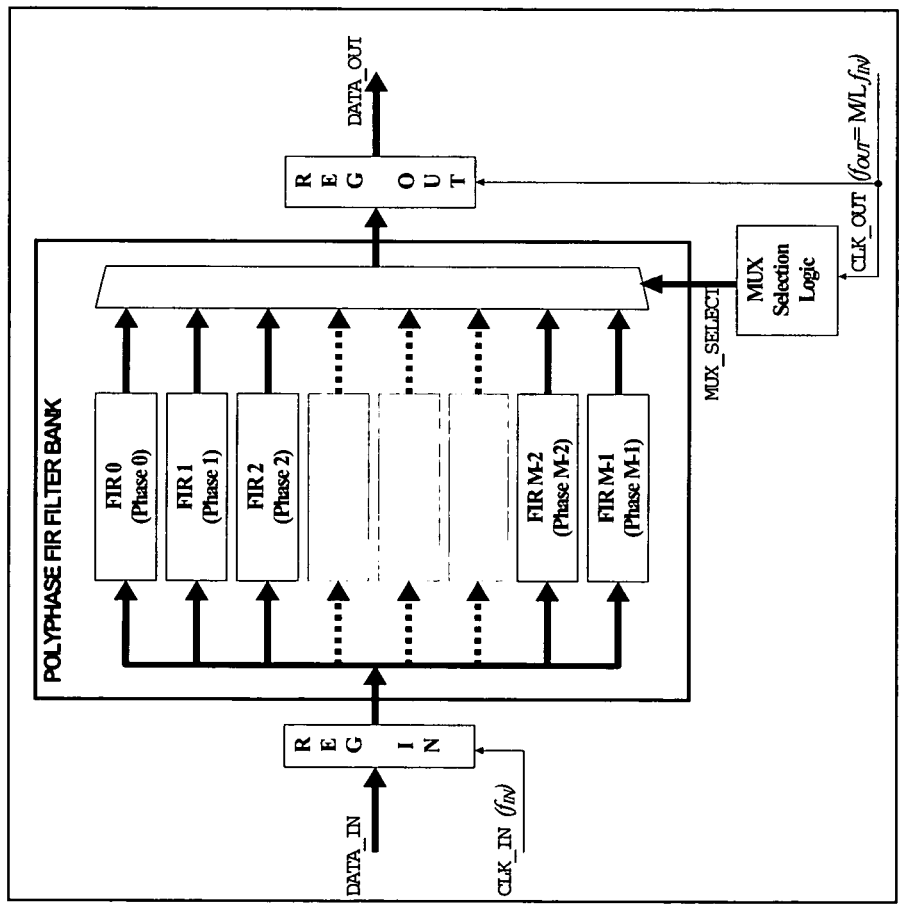
FIG. 1 is a schematic diagram illustrating a polyphase Sample Rate Converter according to the prior art.

Since the 1:P Up-Sampler may be implemented via a polyphase FIR filter, and the Rate Adapting Stage depicted in FIG. 11 is something similar to a FIR filter, it could be difficult to immediately understand why this scheme achieves a simplification of the classical polyphase Sample Rate Converter depicted FIG. 1. The main advantages are in a lot of practical cases the 1:P up-sampler may require an up-sampling factor P<<M (tenths, while M may be hundreds). This will be better explained further below.

The Rate Adapting Stage may be implemented in a simple way. In fact the scheme of FIG. 11 is only a purely theoretical processing scheme, while in practical implementation the Rate Adapting Stage may directly apply eqs. (3), (4), reducing to the block of FIG. 12, such that: the Aliasing Precompensation block just weights each sample of the processed stream (DATA_IN1) at the rate $P*f_{IN}$, instead of executing the weighting window on the stream (DATA_OVS1) at the rate $P*M*f_s$, provided that the weights are applied in an order that is suitably changed from their natural order, as it will be shown later (see equation (12) below). This yields a new stream, DATA_WGH, whose samples are called w2(h), prepared to be processed by the direct sample insertion/cancellation, in such a way that aliases caused by this operation will not affect the output signal band [−$f_s$, $f_s$]. The block named 'Direct insertion/cancellation of samples' executes the following processing): a) directly inserts zeros in suitable locations of the processed stream (DATA_WGH) when up-sampling, as stated by equation (3), after they have been weighted at the previously described processing step; b) directly substitutes some selected pairs of consecutive two samples of the processed stream (DATA_WGH) with their sum in suitable clock cycles when down-sampling, as stated by equation (4), after they have been weighted at the previously described processing step.

In other words, it is seen that the block diagram of FIG. 12 yields a direct implementation of equations (3), (4), and moreover executes the Aliasing Precompensation to avoid the generation of aliases: this is sufficient to provide the Sampling Rate Conversion via the direct M–L zero-padding and the direct L–M cancellation technique, with L, M, pairs suitable in a lot of practical cases, under condition (2), avoiding the generation of aliases.

The Rate Adapting Stage provided in the digital signal processing chain of FIG. 11 is analyzed as well as the reasons underlying the modifications leading to the simplified Low-Complexity Rate Adapting Stage depicted in FIG. 12. To understand this point, it can be noticed that the weighting window in the Rate Adapting Stage in the block diagram of FIG. 11 shall be applied to the data of the stream DATA_OVS1. Since the most of these samples are zeros (it is a zero-padded stream), this fact allows the further great simplification of this block.

In fact the Aliasing Precompensation block just applies the set of weights of the improved weighting window only onto the samples (x1(h)) of the stream DATA_IN1 at the rate $Pf_{IN}$, instead of applying them on the zero padded stream DATA_OVS1 at the rate $PMf_{IN}$. This is possible only if the weights application is executed according to a predetermined order that is different than their natural order. This fact requires a specific procedure in defining the permutation of the weighting coefficients that we are going to analyze in the following: due to the fact that in the stream DATA_OVS1 the non zero-padded samples are located one each M zero-padded samples, and this stream is summed L by L (see FIG. 3, FIG. 4) the order in which the set of weights are to be applied to the stream DATA_IN1 turns out to be defined by the series mod(kM, L), where mod(a,b) means the integer remainder of the division a/b: this condition defines the operations in the Aliasing Precompensation block, in particular it means that the k-th sample of the stream DATA_IN1 shall be multiplied times the weight Wg'(h)=Wg(mod(hM, L)), yielding the samples w2(h) of the stream DATA_WGH (see FIG. 12):

$$w2(h)=Wg(mod(hM, L))*x1(h); \quad (12)$$

The above equation holds whichever weighting window is selected.

Now we are going to analyze more deeply the criteria for selecting the weights to be used. As a matter of fact any weighting window could be used in the Aliasing Precompensation block of the inventive architecture depicted in FIG. 11 and FIG. 12, provided that it guarantees sufficient aliasing suppression. The window to be used should be shaped as a generic, finite energy pulse. Although a wide variety of weighting windows is available in the technical literature, the following family of windows has been chosen:

$$Wg(j)=(2^{2Q})[x(j)*(1-x(j))]^Q x(j)=j/(L-1), j=0, 1, \ldots, (L-1);$$ (13)

In fact this family provided the best performances.

Figure 14:
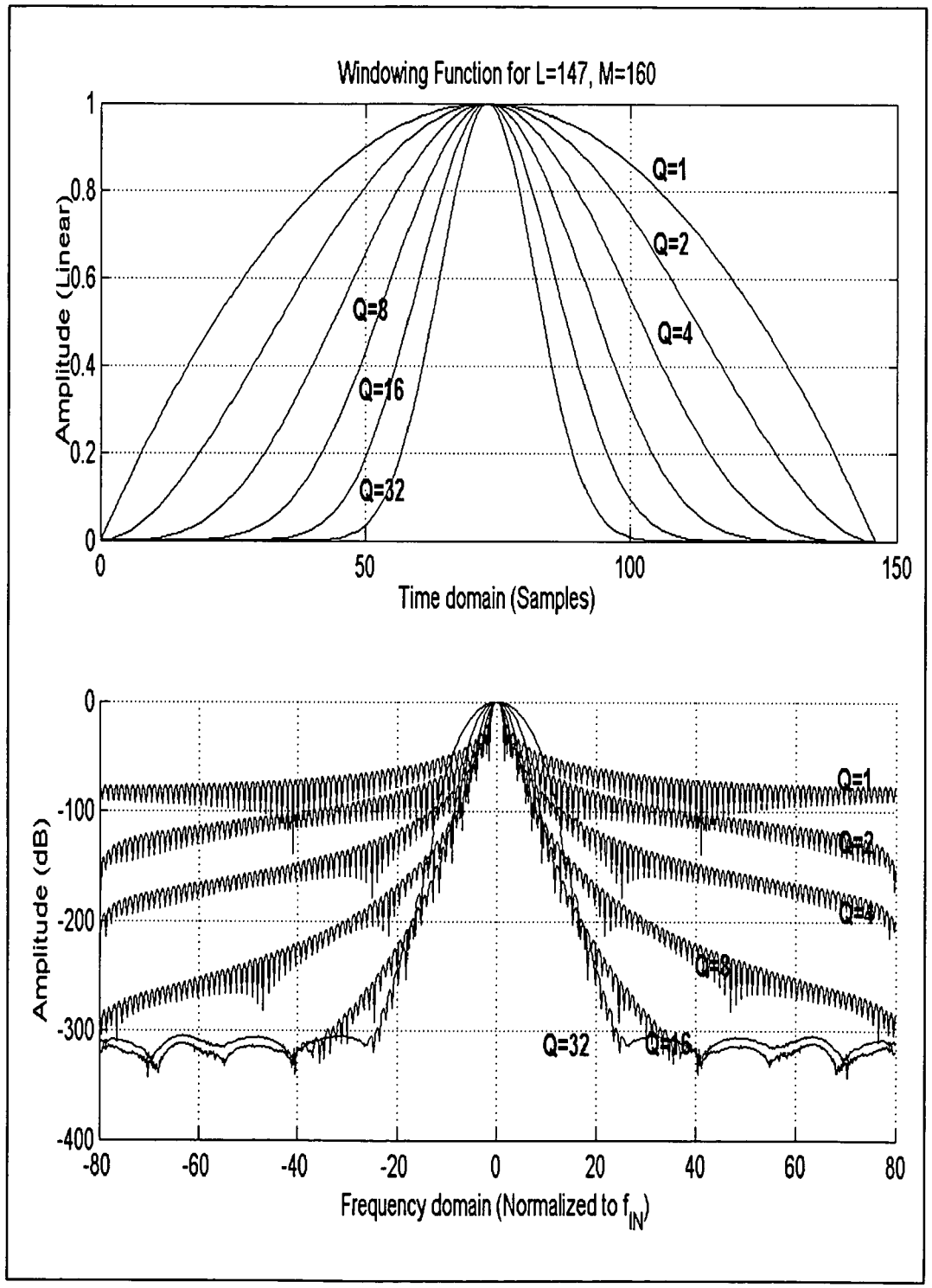
FIG. 14 is a graph illustrating Windowing functions for the weighting window depicted in FIG. 11.

Time and spectral characteristics of this family of windows are shown in FIG. 14. It may be seen that an excellent frequency behavior in terms of trade-off between selectivity of the pass-band and attenuation of the stop-band is shown. Usage of this particular window is to be intended as a preferred choice, however other weighting windows might be used to implement the method. Moreover, this family is particularly suitable to be runtime computed, due to its very simple form.

Figure 13:
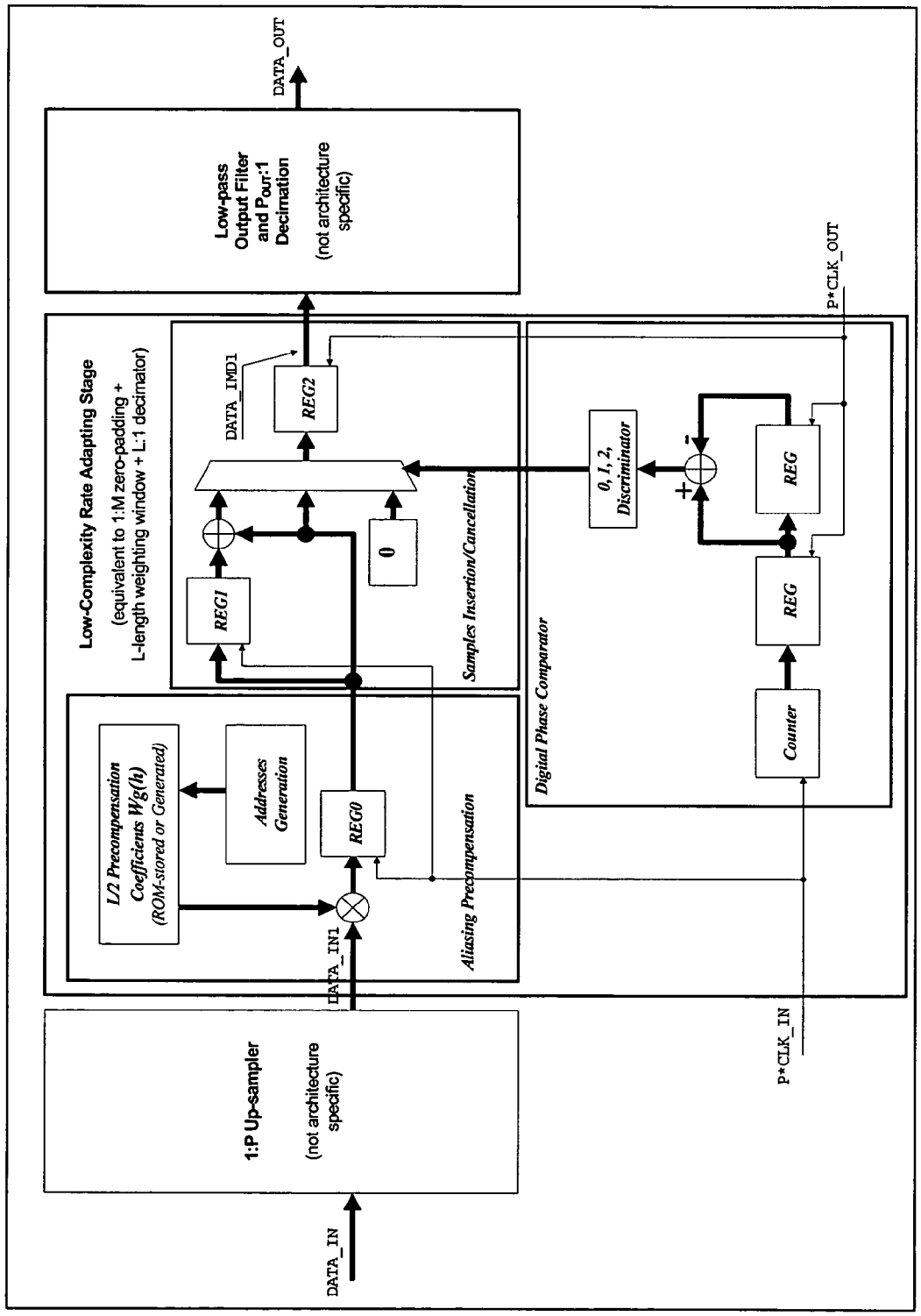
FIG. 13 is a schematic diagram illustrating a circuit implementing a F-SRC architecture according to the present invention.

The number of used weights is L, therefore only L/2 memory locations are required to implement this windowing function (the window is symmetric). As far as the sample insertions/cancellations are concerned, they occur in |M−L| cycles each L input clock cycles, thus achieving the target output rate of M/Ts sample per second. The clock cycles in which sample insertions/cancellations should be executed may be recognized via a digital phase comparator that directly checks the 'if' conditions expressed in equations (3), (4), as shown in FIG. 13. A SW implementation requires computation of the sequence div(kL,M), that is a periodical sequence with period M.

It's pointed out that the main drawback of the described method is that there are some pairs L, M, such that the reduction of the polyphase FIR filter cannot be applied, resulting P=M: this fact occurs when |M−L|=1. However the method turns out to be applicable in all other cases. To better clarify this point, consider that P may be chosen as the minimum up-sampling rate that allows pushing outside of the band $[-f_s/2, f_s/2]$ only the aliases generated by those critical images too hard to be filtered by the weighting window (i.e.: the nearest images to $f_o=0$). Hence an estimation of the P value can be achieved from Equations (9), (10), (11): in fact from these equations it can be obtained that the image $f_i$ (−1) (i.e.: the hardest to be filtered) generates the |M−L|$^{th}$ alias, i.e.: $f_a$(M−L). Since this alias is located at a distance $|M-L|\Delta f_a=|M-L|*(f_{OUT}/M)$ from $f_o=0$, we can relocate it at a distance greater then $f_{OUT}$ from $f_o=0$ by adopting the suitable up-sampling rate: to this end, we just need a P factor:

$$P \geq P_{min}=M/|M-L|$$ (14)

and this may result much lower than the M up-sampling factor required by the polyphase Sample Rate Converter architecture.

Referring now to a possible implementation when L/M>2 or L/M<0.5, the following considerations hold: When the ratio L/M>2 (up-sampling) or L/M<0.5 (down-sampling) the processing scheme needs to be slightly modified. In fact we consider two coprime integer numbers, s, p, such that:

$$\frac{L}{M} = \frac{pP}{sP}\frac{sL}{pM}$$

and $$0.5 < \frac{sL}{pM} < 2$$

These equations show that the presented method may still be applied by substituting M'=pM and L'=sL. The only difference in this case is that we must use an output decimation factor $P_{OUT}$ different from the input up-sampling factor P.

Figure 16:
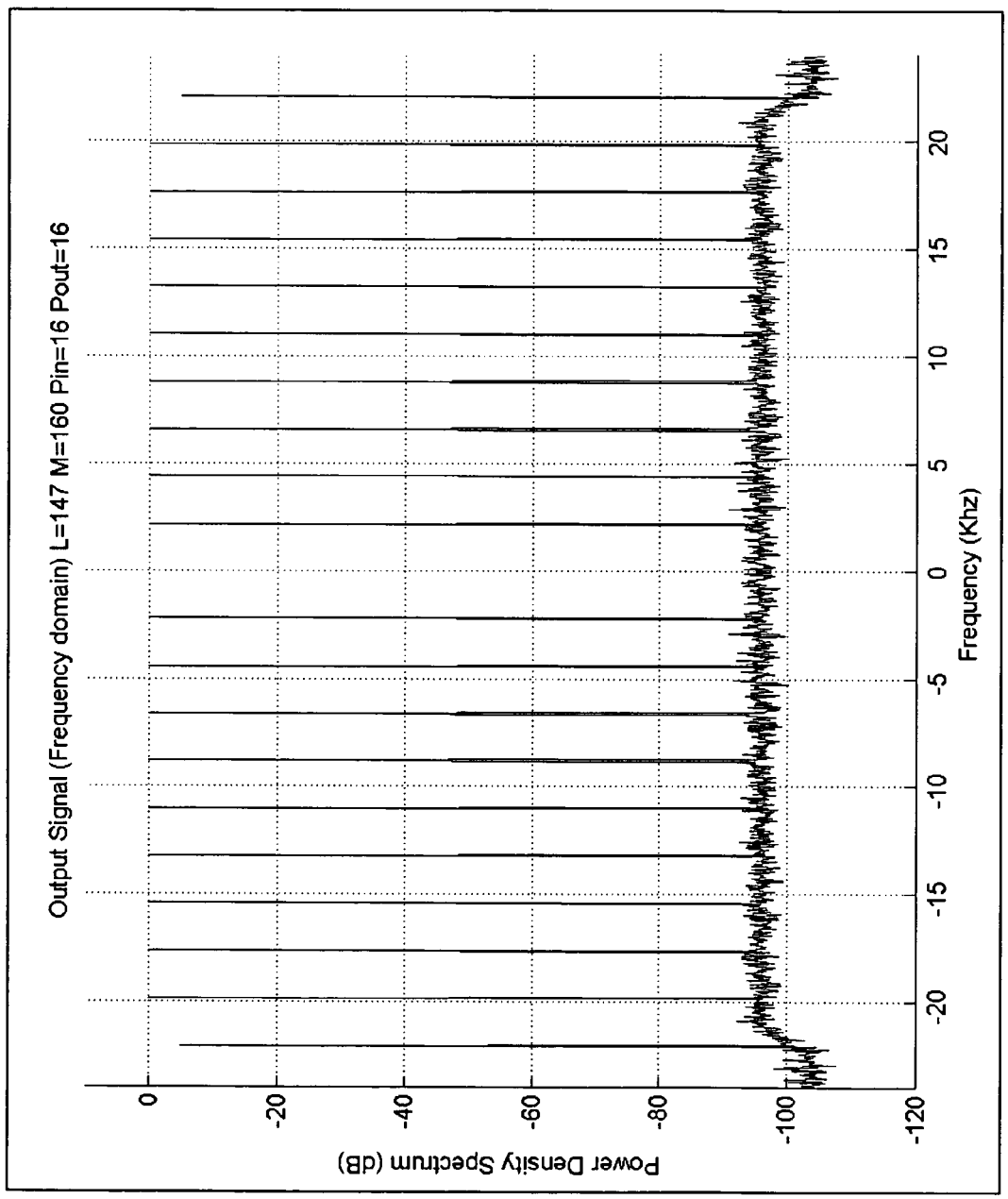
FIG. 16 is a graph illustrating spectral characteristics for 44.1 kHz to 48 KHz SRC whose specification are given in FIG. 15: DATA_OUT signal when the input is the sum of 10 different sinusoidal signals, with same spectral separation.

Example, in the following step we will consider numerical results for a 44.1 KHz to 48 KHz Sample Rate Converter. The presented method may be applied to design a 16 bits, high resolution, 44.1 KHz to 48 KHz Sample Rate Converter. This implementation is useful to convert a CD data stream to DAT (Digital Audio Tape). The example of implementation requires an input polyphase FIR filter and a three-stage IIR output filter. Specifications and achieved results are listed in the FIG. 15, while spectral characteristics are shown in FIG. 16, FIG. 17. Note that FIG. 16, represents the output spectrum when the input signal is built by 10 different harmonics located within the [0–20 KHz] band, with same spectral distance each other.

As far as the memory occupation is concerned, both ROM memory and RAM (Random Access Memory) memory are required: ROM memory is used for coefficients storage, while RAM memory is used as input data buffer (tap lines). It is seen that the example implementation requires a whole of 580 ROM locations to store the FIR coefficients and the set of weights Wg(h). Note that the output IIR filter just require 18 ROM words as coefficients storage, while the remaining ROM is used for the input FIR coefficients (488 words) and the set of weights for the Aliasing Precompensation block (74 words).

The RAM memory is used basically to implement the FIR tap lines, and it turns out to be 82 words. This is due to the fact that the input polyphase filter needs a number of memory locations equal to the taps of each single phase (64 taps) and the IIR filter, built by 3 IIR stages of $6^{th}$ order, just requires 18 RAM words as data buffer.

The invention claimed is:

1. A method for implementing an L:M Fractional Sample Rate Converter (F-SRC), for controlled and direct insertion/cancellation of samples in a processed data stream, the method comprising:
   receiving an input data stream with an input block, processing L signal samples (x(m)) having an input data rate ($f_{in}$), in a predetermined time interval ($T_s$);
   generating an interpolated data stream upsampled times a factor P (P<M), by the input block providing signal samples (x1($h$)) having a data rate P$f_{in}$;
   generating an intermediate data stream with a rate adapting stage receiving the signal samples from the input block, and providing signal samples (y1($k$)) adapted to an intermediate data rate (P$f_{out}$);
   delivering an output data stream with a low pass and P:1 decimation filter receiving the signal samples from the rate adapting stage, including M signal samples having a desired output data rate ($f_{out}$=M/$T_s$);
   generating an up-sampled weighted stream in the rate adapting stage by weighting the signal samples (x1($h$)) of the interpolated data stream; and adapting the input data rate in the rate adapting stage to the output data rate by a direct insertion of zero-padded samples into the up-sampled weighted stream when L<M, and by a direct cancellation of samples when L>M.

2. The method according to claim 1, wherein the rate adapting stage includes:
an up-sampling mode, when L<M and $f_{IN}<f_{OUT}$, generating the intermediate stream, with signal samples y1(k) at the intermediate data rate ($Pf_{OUT}$), by directly inserting M−L zeros each L input samples of the up-sampled weighted stream; and
a down-sampling mode, when L>M and $f_{IN}>f_{OUT}$, generating the intermediate stream, with signal samples y1(k) at the intermediate data rate ($Pf_{OUT}$), by canceling L−M samples each L input samples of the up-sampled weighted stream, wherein canceling comprises substituting some selected pairs of samples with their sum.

3. The method according to claim 2, wherein in the up sampling mode (L<M), zero-padded samples are inserted in locations of the up-sampled weighted stream with signal samples w2(h) at a data rate $PF_{IN}$, according to the following formulas:

$y1(k)=0$, when $div(kL,M)=div((k-1)L,M)$; and $y1(k)=w2(div(kL,M))$, when $div(kL,M) \neq div((k-1)L,M)$;

where div(a,b) denotes the integer part of a/b, thus generating samples y1(k) of the intermediate data stream at the intermediate data rate $Pf_{OUT}$.

4. The method according to claim 2, wherein in the down sampling mode (L>M), data are cancelled from the up-sampled weighted stream with signal samples w2(h) at a data rate $Pf_{IN}$, by substituting some selected pairs of samples with their sum, according to the following formulas:

$y1(k)=w2(div(kL,M))+w2(div(kL,M)+1)$, when $div(kL,M)=div((k-1)L,M)+2$; and $y1(k)=w2(div(kL,M))$, if $div(kL,M) \neq div((k-1)L,M)+2$;

thus generating samples of the intermediate data stream at the intermediate data rate $Pf_{OUT}$.

5. The method according to claim 1, wherein weighting the signal samples x1(h) of the up-sampled data stream in the rate adapting stage prevents aliases generation due to the samples insertions and cancellations; a set of weights Wg(h) is applied to the signal samples in an order, different than a natural order, thus generating the samples w2(h) of the up-sampled weighted stream according to the following equation:

$w2(h)=x1(h)*Wg(mod(hM,L))$, $h=0, 1, 2 \ldots$, where mod(a,b) denotes the remainder of the division a/b.

6. The method according to claim 5, wherein the set of weights Wg(h) is computed according to the following equation:

$Wg(h)=K_o|q(h)*(1-q(h))|^Q$; $q(h)=h/(L-1)$, $h=0, 1, \ldots, (L-1)$;

$K_o$ being a normalization factor and Q a parameter selected to obtain the desired alias suppression.

7. The method according to claim 1, wherein the input block, includes an up-sampler (1:P) for interpolating the signal samples (x(m)) of the input signal times a P up-sampling factor, thus increasing the input data rate from $f_{IN}$ to $P*f_{IN}$, where $P \geq P_{min}=M/|M-L|$, P<M.

8. The method according to claim 1, wherein the rate adapting stage, receives a data stream with a data rate of $P*f_{IN}$, and outputs a data stream with a data rate of $(M/L)*P*f_{IN}=P*f_{OUT}$.

9. An L:M Fractional Sample Rate Converter (F-SRC) architecture for controlled and direct insertion and cancellation of samples in a processed data stream, comprising:
an up-sampler (1:P) input block receiving an input data stream and processing L signal samples (x(m)) having an input data rate ($f_{IN}$) in a predetermined time interval ($T_s$), and providing an interpolated data stream upsampled by a factor P, P<M, therefore having a $Pf_{IN}$ data rate;
a rate adapting stage generating an intermediate data stream with signal samples (y1(k)) adapted to an intermediate data rate ($Pf_{OUT}$); and
a low pass and decimation filter delivering an output data stream including M signal samples (z(n)) having a desired output sample rate ($f_{OUT}=M/T_s$);
the rate adapting stage weighting the signal samples (x1(h)) of the interpolated data stream; and
the rate adapting stage adapting the input data rate to the output data rate by a direct insertion of zero samples into the processed stream when L<M, and by a direct cancellation of samples when L>M.

10. The L:M Fractional Sample Rate Converter (F-SRC) architecture according to claim 9, wherein said low-pass and decimation filter is structured to decimate the intermediate data stream times a factor P thus reducing the output rate down to $(M/L)*f_{IN}=F_{OUT}$.

11. The L:M Fractional Sample Rate Converter (F-SRC) architecture according to claim 9, wherein said low-pass and decimation filter is structured to suppress possible aliases falling out of a Nyquist output band $[-f_{IN}/2, f_{IN}/2]$ in the intermediate data stream before a P:1 decimation is executed.

12. The L:M Fractional Sample Rate Converter (F-SRC) architecture according to claim 9, wherein said up-sampler (1:P) input block provides interpolation by an up-sampling factor P<M, $P \geq P_{min}=M/|M-L|$.

13. The L:M Fractional Sample Rate Converter (F-SRC) architecture according to claim 10, wherein the decimation factor P of the low-pass and decimation filter is equal to the up-sampling factor P of the up-sampler input block.

14. The L:M Fractional Sample Rate Converter (F-SRC) architecture according to claim 10, wherein when the decimation factor of the low-pass and decimation filter is different from the up-sampling factor P of the up-sampler input block, a conversion rate is given by $(LP)/(MP_{OUT})$, where $P_{OUT}$ denotes the decimation factor of the low-pass and decimation filter in the case $P_{OUT} \neq P$.

15. An L:M Fractional Sample Rate Converter (F-SRC) comprising:
an up-sampler receiving an input data stream and processing L signal samples (x(m)) having an input data rate ($f_{IN}$) in a predetermined time interval ($T_s$), and providing an interpolated data stream upsampled by a factor P, P<M, and having a $Pf_{IN}$ data rate;
a rate adapting stage weighting the signal samples (x1(h)) of the interpolated data stream and generating an intermediate data stream, the rate adapting stage adapting the input data rate to an output data rate by a direct insertion of zero samples into the data stream when L<M, and by cancellation of samples when L>M; and a decimation filter receiving the intermediate data stream and delivering an output data stream including M signal samples having the output data rate ($f_{OUT}$=M/$T_s$).

16. The L:M Fractional Sample Rate Converter (F-SRC) according to claim 15, wherein said decimation filter decimates the intermediate data stream by a factor P to reduce the output rate down to (M/L)*$f_{IN}$=$F_{OUT}$.

17. The L:M Fractional Sample Rate Converter (F-SRC) according to claim 15, wherein said decimation filter suppresses aliases falling out of a Nyquist output band [$-f_{IN}$/2, $f_{IN}$/2] in the intermediate data stream before a P:1 decimation is executed.

18. The L:M Fractional Sample Rate Converter (F-SRC) according to claim 15, wherein said up-sampler provides interpolation by an up-sampling factor P<M, P≧$P_{min}$=M/|M−L|.

19. The L:M Fractional Sample Rate Converter (F-SRC) according to claim 16, wherein the decimation factor P of the decimation filter is equal to the up-sampling factor P of the up-sampler.

* * * * *

UNITED STATES PATENT AND TRADEMARK OFFICE
CERTIFICATE OF CORRECTION

PATENT NO.         : 7,126,505 B2
APPLICATION NO. : 11/065013
DATED              : October 24, 2006
INVENTOR(S)        : Avantaggiati It is certified that error appears in the above-identified patent and that said Letters Patent is hereby corrected as shown below:

Column 3, Line 36          Delete: "$DATA_{13}IN$"
                           Insert -- DATA_IN --

Column 12, Line 20         Delete: ";"
                           Insert -- ; wherein--

Signed and Sealed this

Twenty-ninth Day of May, 2007

JON W. DUDAS
*Director of the United States Patent and Trademark Office*